United States Patent [19]

Ali

[11] 4,117,541
[45] Sep. 26, 1978

[54] CONFIGURABLE PARALLEL ARITHMETIC STRUCTURE FOR RECURSIVE DIGITAL FILTERING

[75] Inventor: Mian Zaheer Ali, Gaithersburg, Md.

[73] Assignee: Communications Satellite Corporation, Washington, D.C.

[21] Appl. No.: 849,279

[22] Filed: Nov. 7, 1977

[51] Int. Cl.² .......................... G06F 15/34; H04B 3/04
[52] U.S. Cl. ............................... 364/724; 179/15 FD; 333/18; 364/726
[58] Field of Search .................. 364/724, 726; 325/42; 333/18, 28 R; 179/15 FD

[56] References Cited
U.S. PATENT DOCUMENTS 3,706,076  12/1972  Schuster ............................ 364/724
3,749,895  7/1973  Kao ................................. 364/724 X Primary Examiner—Jerry Smith
Attorney, Agent, or Firm—Sughrue, Rothwell, Mion, Zinn and Macpeak

[57] ABSTRACT

An FDM/TDM transmultiplexer uses sampling rate multiplication to increase the sampling rate for time division multiplexed (TDM) to frequency division multiplexed (FDM) conversion and decrease the sampling rate for FDM to TDM conversion. The rate multiplication filters are realized digitally in order to exploit the computational advantage of Fast Fourier Transform (FFT) algorithm, and channel filtering is implemented by a single time-shared sixth-order elliptic digital recursive filter. A novel FFT processor and recursive filter are disclosed which may be used in the system.

7 Claims, 29 Drawing Figures

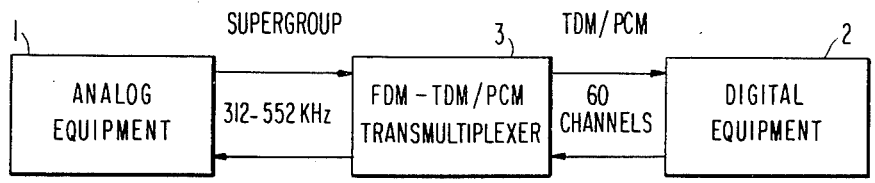
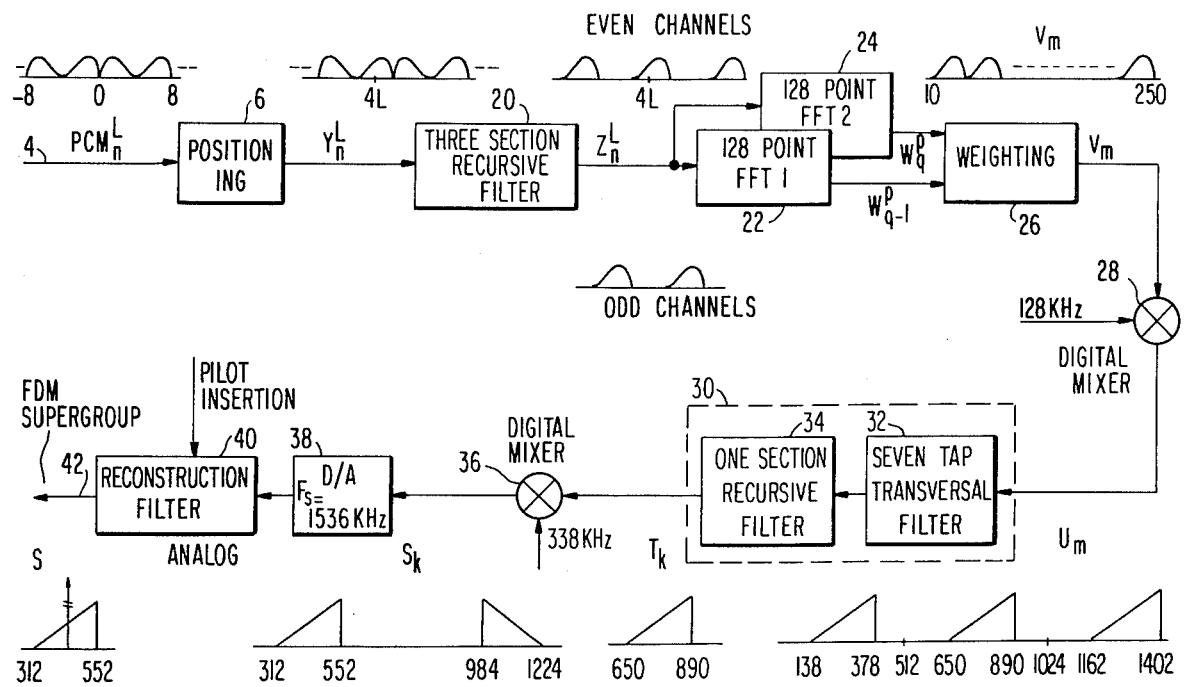
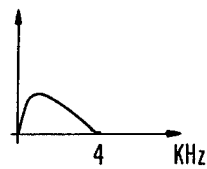
FIG.3
| n | L | $e^{-j(-1)^L \frac{\pi n}{2}}$ | PROM OUTPUT |
|---|---|---|---|
| 0 | EVEN | 1 | 0 |
|   | ODD | 1 | 0 |
| 1 | EVEN | -1 | 1 |
|   | ODD | +1 | 0 |
| 2 | EVEN | -1 | 1 |
|   | ODD | -1 | 1 |
| 3 | EVEN | +1 | 0 |
|   | ODD | -1 | 1 |
FIG.5
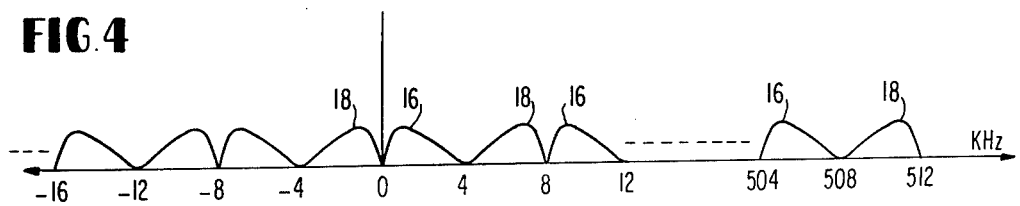
FIG.4

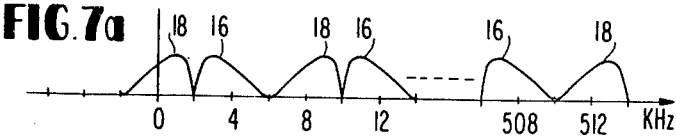
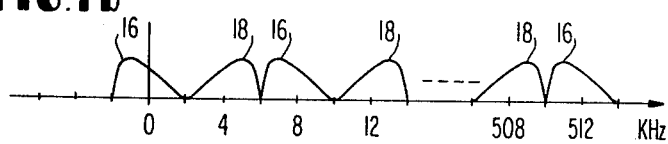
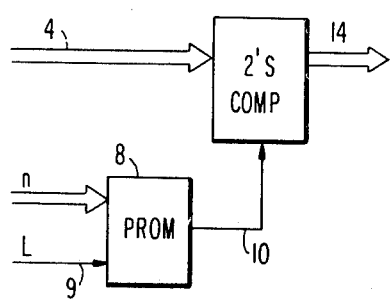
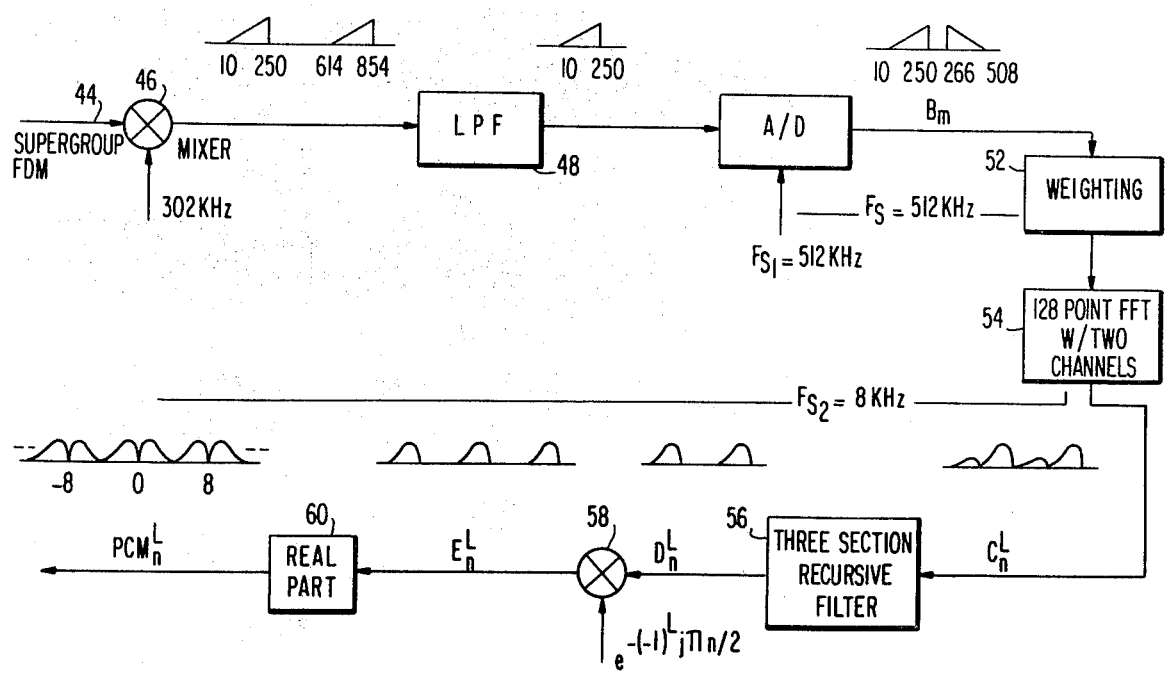
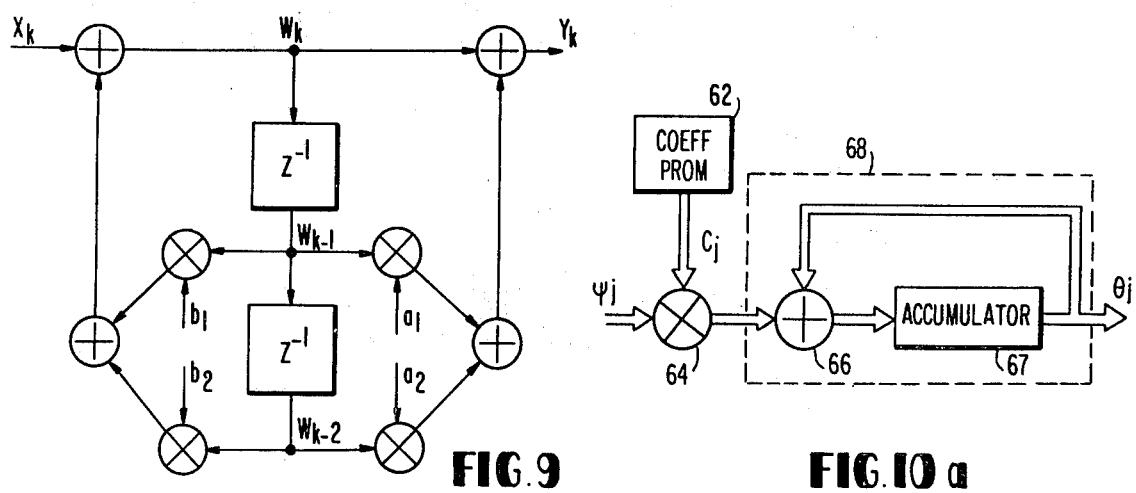

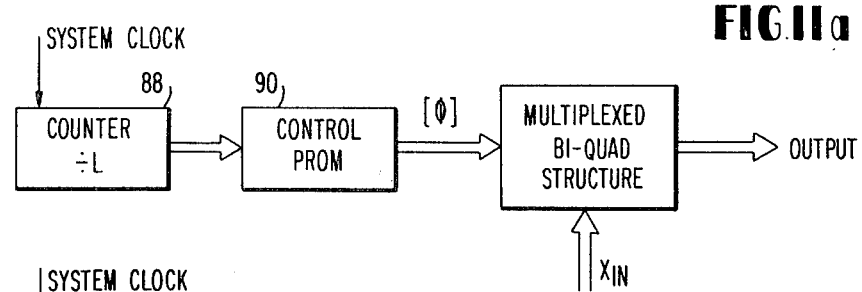
FIG. 11a
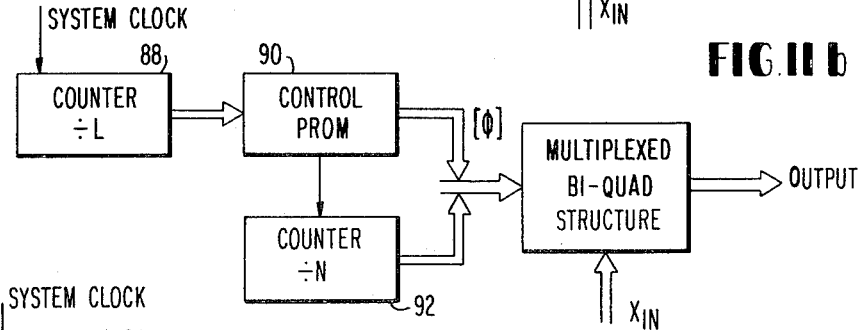
FIG. 11b
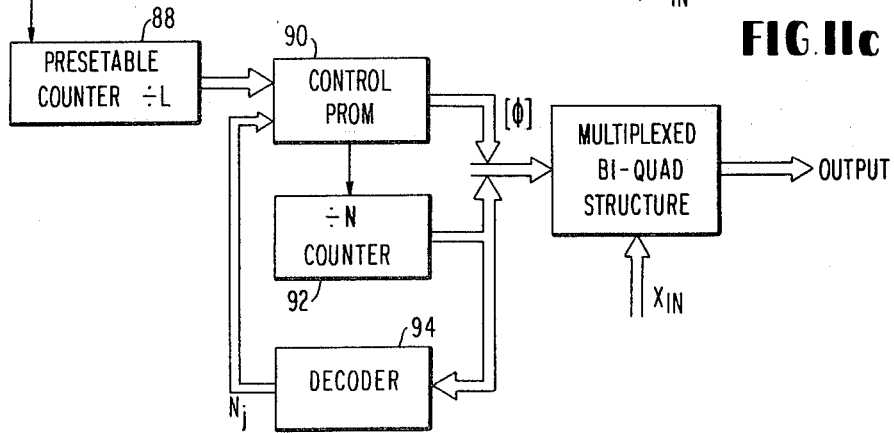
FIG. 11c
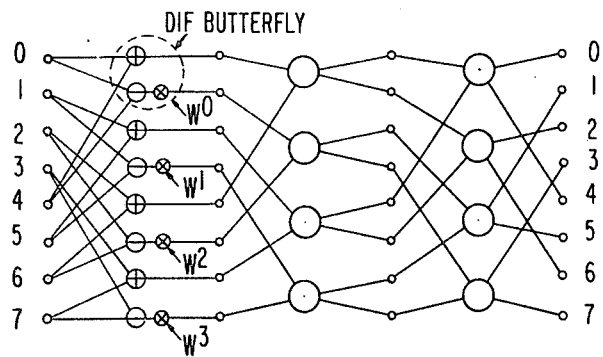
FIG. 12a 8-POINT FIXED GEOMETRY FFT
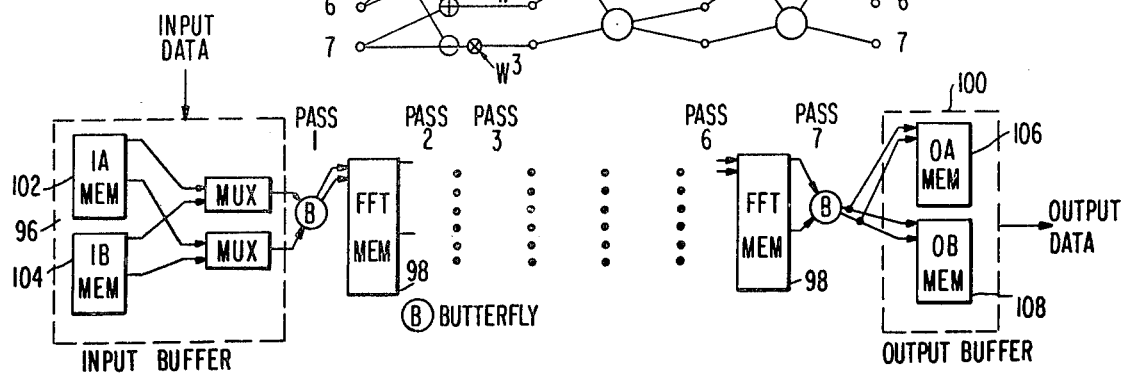
FIG. 12b FFT PROCESSING CYCLE

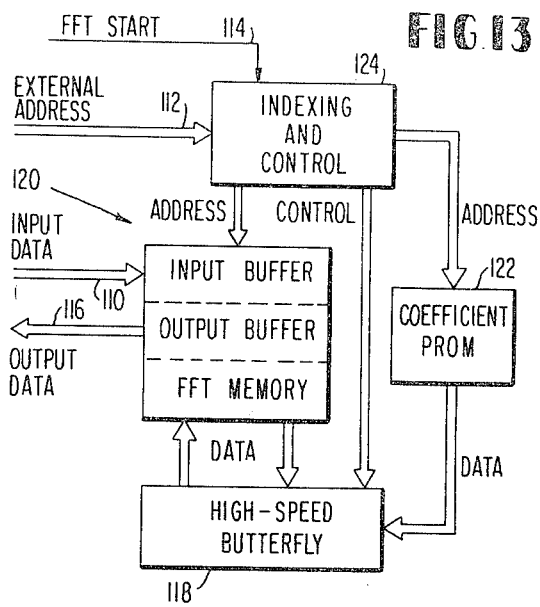
FIG.13
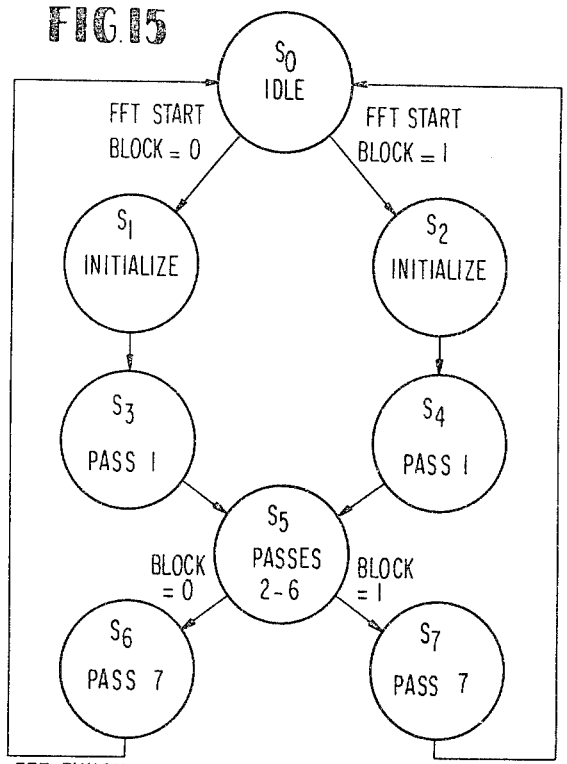
FIG.15
FIG.14
$P' = P+Q$
$Q' = (P-Q) \times W$
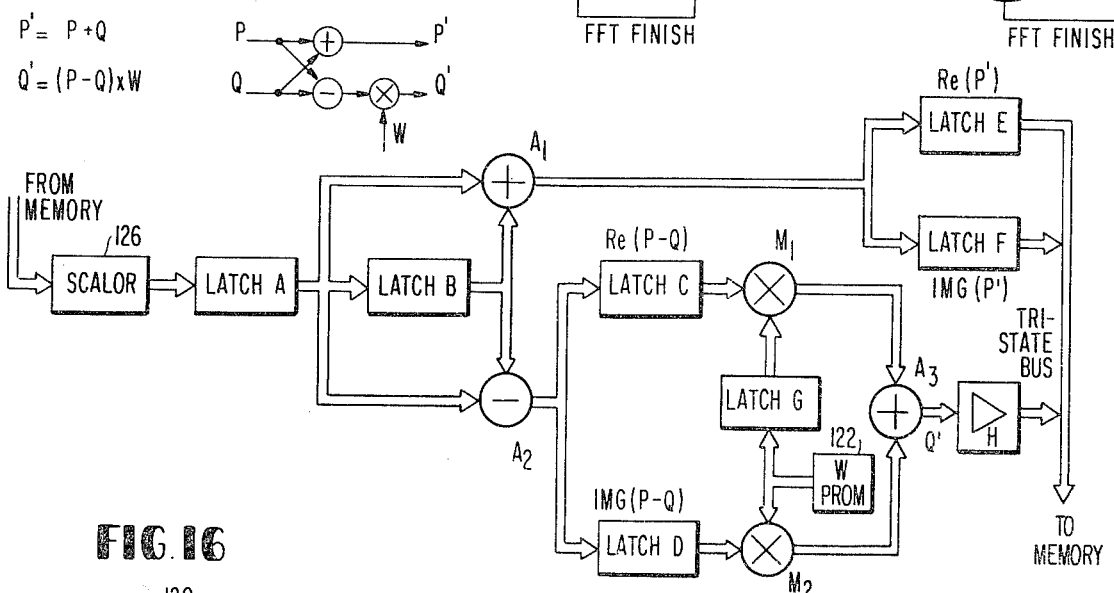
FIG.16
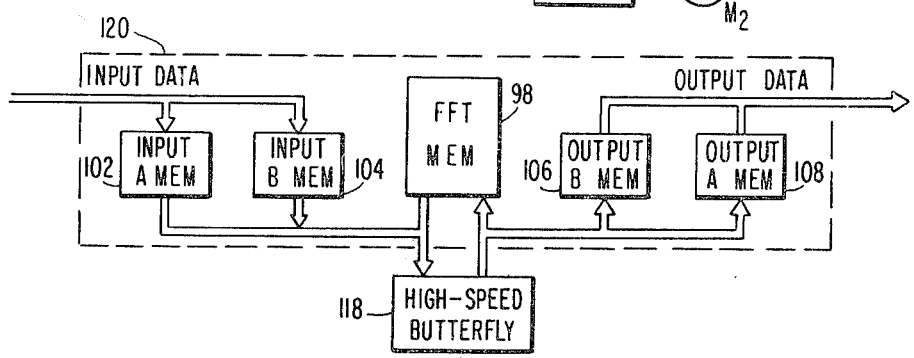

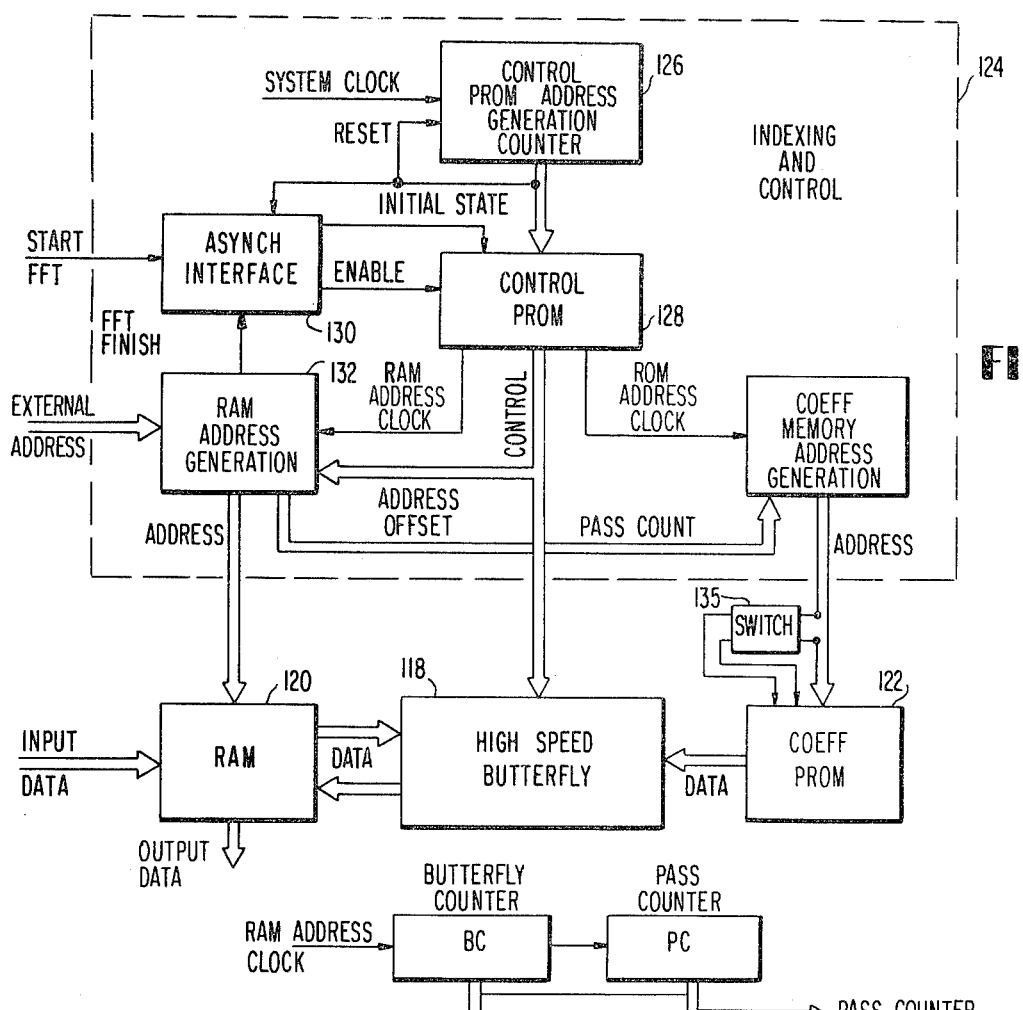
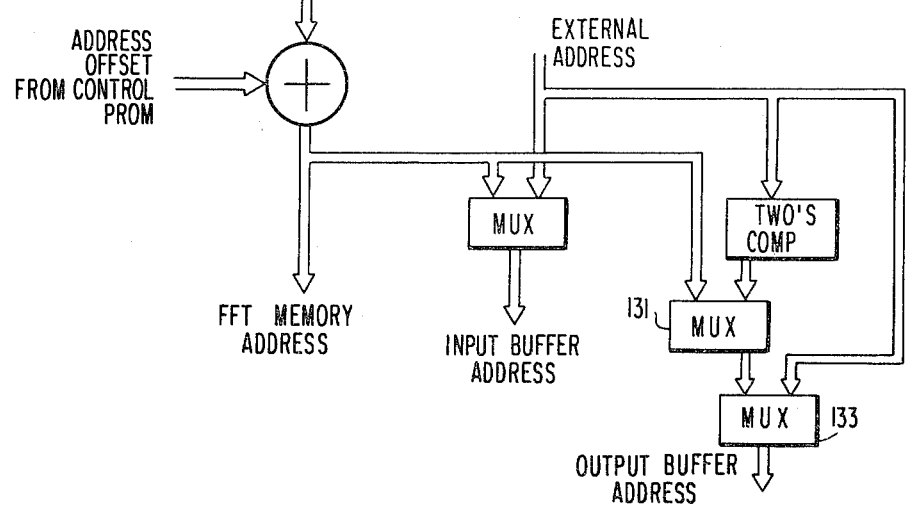

PROGRAM
FOR CONTROL
PROM

* NUMBER OF BUTTERFLIES THE COEFFICIENTS ARE HELD FOR

CONFIGURABLE PARALLEL ARITHMETIC STRUCTURE FOR RECURSIVE DIGITAL FILTERING

BACKGROUND OF THE INVENTION

This application is related to my copending application Ser. No. 849,584 entitled "FDM/TDM Transmultiplexer" and Ser. No. 849,271 entitled "High-Speed FFT Processor," assigned to the same assignee as the present invention.

In each of the above-mentioned applications, I have disclosed an FDM/TDM transmultiplexer which is capable of very high operating speeds while requiring very little space. The transmultiplexer is designed to convert 60-channel super groups from FDM-to-TDM and vice versa. Since, in addition to providing a transmultiplexer capable of processing 60-channel super groups, it was also my purpose to simplify the maintenance and decrease both the size requirements of the transmultiplexer and the cost of manufacturing it, a modular design format was adopted. The TDM-to-FDM conversion channel required a sixth-order elliptic filter having a 2 kHz cut-off and also required a second-order filter. The FDM-to-TDM conversion channel required only the sixth-order elliptic filter having the 2 kHz cut-off. In order to conserve size and cost, it was preferable to use in each case a single filter multiplexed over all 60 channels rather than a bank of filters, one for each channel.

Several problems were encountered in obtaining such a filter. Since each of the sixth-order filters had to be reconfigured as low-pass filters for even channels and bandpass filters for odd channels, it was necessary to use a filter capable of changing its frequency response very rapidly. In order to serve the modular design concept to both simplify maintenance and decrease production costs by enabling mass production of modular components, a single filter structure was needed which could serve as both the second-order filter and the sixth-order filter. Thus, a filter was needed which was flexible enough to be used for both filtering functions, which was also capable of high-speed real time reconfiguration and, finally, which was capable of sufficiently high operating speeds to enable multiplexing the filter structure over all 60 channels.

Known arithmetic structures for achieving digital filtering are either too slow to achieve both real time reconfiguration and multiplexing over 60 channels, or do not exhibit the required programming flexibility.

It was discovered through computer simulation that the out-of-band loss requirements of the transmultiplexer could be achieved by cascading three bi-quad arithmetic structures in order to achieve a sixth-order elliptic filter, but it was necessary to design such a structure capable of being cascaded while simultaneously being multiplexed over 60 voice channels and reconfigured in real time as a low-pass and bandpass filter for alternating channels.

SUMMARY OF THE INVENTION

It is an object of this invention to provide an arithmetic structure exhibiting high programming flexibility.

It is a further object of this invention to provide a bi-quad section which can be programmed to achieve higher order digital filters by simulating parallel or cascade arrangement of bi-quad sections.

It is a further object of this invention to provide a high-speed programmable bi-quad section which can achieve multi-section filter response and is capable of sufficiently high operating speeds so that it can be multiplexed over a large number of channels while also being reconfigured in real time between channels to present a different filter response for alternate channels.

These and other objects are achieved by providing a single bi-quad section having parallel multipliers and parallel address. The structure preferably uses random access memories (RAMs) for intermediate storage, and flexibility of the structure is achieved by designing around a tri-state buss so that multiplexers are not required for inter-memory data transfer. Multiplexing of this arithmetic structure over N filters having M bi-quad sections can be achieved by programming, and simplicity in timing and control is achieved by control programmable read-only memories (PROMs). Techniques are also disclosed for reducing the size of the control PROMs for various multiplexing conditions.

BRIEF DESCRIPTION OF THE DRAWINGS

FIG. 1 is a functional block diagram of the FDM/TDM-PCM transmultiplexer according to the present invention.

FIG. 2 is a block diagram showing the TDM-PCM to FDM operation of the transmultiplexer according to the present invention.

FIG. 3 is a plot of the frequency spectrum occupied by a voice channel.

FIG. 4 is an illustration of the multiple image frequency spectrum which results from sampling a voice channel at 512 kHz.

FIG. 5 is a table which illustrates the operation of the positioning circuit in FIG. 2.

FIG. 6 is a block diagram of the positioning circuit of FIG. 2.

FIG. 7a and 7b illustrate the frequency spectra of even and odd channels, respectively, at the output of the positioning circuit of FIG. 2.

FIG. 8 is a block diagram showing the FDM to TDM-PCM operation of the transmultiplexer according to the present invention.

FIG. 9 is a block diagram illustrating the arithmetic operation of a bi-quad section, which can be used for implementing higher order recursive filters.

FIG. 10a–10d represent successive stages in the design of a high-speed multiplexed bi-quad recursive filter section according to the present invention.

FIGS. 11a–11c are block diagrams of multiplexed bi-quad recursive filters using the filter section shown in FIG. 10d.

FIGS. 12a and 12b are block diagrams illustrating the successive operating steps of an FFT processor.

FIG. 13 is a block diagram of an FFT processor according to the present invention.

FIG. 14 is a block diagram of the HSB shown in FIG. 13.

FIG. 15 is a state diagram illustrating the operation of the FFT processor shown in FIG. 13.

FIG. 16 is a block diagram showing the memory organization of the FFT processor shown in FIG. 13.

FIG. 17 is a block diagram of the indexing and control circuit in the FFT processor shown in FIG. 13.

FIG. 19 is a block diagram of the RAM address generation circuit shown in FIG. 17.

DETAILED DESCRIPTION OF THE DRAWINGS

Figure 10B:
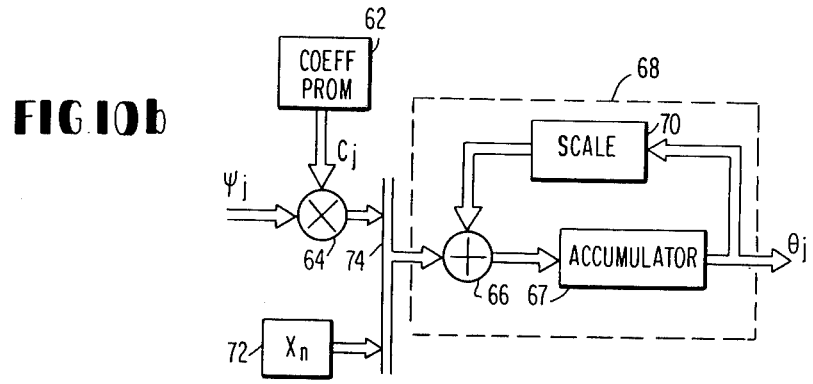

For ease of understanding, certain signalling frequencies, sampling frequencies and frequency bands will be used in the description of the present invention, but it should be understood that the present invention is not limited to operation at these frequencies.

FIG. 1 is a block diagram illustrating the function of the present invention. Existing analog communications equipment 1 operates in FDM, usually transmitting signals in the form of 60-channel super groups occupying a composite band width of 312–552 kHz. Digital equipment 2, which is finding increasingly wide-spread use in the communications field, typically operates in TDM-PCM, and in order to provide compatibility between digital and analog equipment, a transmultiplexer 3 is needed which will convert the 60-channel analog FDM super group occupying a 240 kHz band width to a TDM-PCM signal also occupying a 240 kHz band width.

FIG. 2 is a block diagram illustrating the TDM-PCM to FDM conversion operation of the transmultiplexer according to the present invention. The input 4 to the transmultiplexer consists of 64 TDM-PCM channels at a sampling rate of 8 kHz. The PCM signal originally included 60 voice channels, but four dummy channels numbered 0, 1, 2 and 63 have been added to the original 60 PCM channels due to the binary nature of the system. The addition of the four extra channels makes the system simpler in design since binary numbers are easier to work with, but it should be noted that the transmultiplexer according to the present invention could be designed to process any number of channels. Since voice information is being transmitted, the frequency spectrum of each channel occupies the 0–4 kHz band as shown in FIG. 3. It is known that sampling a signal at a sampling rate which is an integral multiple of the highest frequency in the occupied band will result in a "folding over" effect which produces multiple side bands. Although the sampling rate per channel in the 64-channel PCM signal is 8 kHz, the multiplexed 64 channels will have a composite sampling rate of 512 kHz, resulting in multiple upper and lower side bands 16 and 18, respectively, for each channel as shown in FIG. 4. In order to achieve a base band FDM signal, it is convenient to position the frequency spectra of each channel so that there are 64 lower side bands 18 occupying 64 distinct 4 kHz bands between 0 kHz and 256 kHz. The 64 PCM channels are frequency positioned by positioning means 6 so that a lower side band of each Lth channel (L = 0, 1 ... 63) channel is positioned at the center frequency 4L kHz. This is accomplished by modulating the even channels up by 2 kHz and odd channels down by 2 kHz.

The position modulation can be accomplished as follows. It can be shown that multiplication of an incoming TDM-PCM signal by the quantity $$e^{-j(-1)^L \frac{\pi n}{2}},$$

where L is the channel number and $n$ is a running multiplex frame index, will result in the frequency spectrum of even channels being shifted up by 2 kHz and that of odd channels being shifted down by 2 kHz. Since we know that $$e^{-j(-1)^L \frac{\pi n}{2}} = \cos \frac{\pi n}{2} - j(-1)^L \sin \frac{\pi n}{2} \quad (1)$$

we can see that as long as $n$ is an integer, equation (1) will always have a value of either $+1$ or $-1$. This can be seen from the table of FIG. 5. One possible embodiment of the positioning means 6 is illustrated in FIG. 6. Since the multiplication factor is either $+1$ or $-1$, the circuit can be very simple. L and $n$ information is supplied to a PROM 8, the => indicating that the information contains a plurality of bits supplied in parallel. Since it is only important whether L is even or odd, the L input signal 9 to the PROM 8 need only be the least significant bit (LSB) of each channel. The output 10 of the PROM will correspond to the value of equation (1) above. Multiplication by $-1$ can be achieved by taking the two's complement of a binary signal and, therefore, the two's complement circuit 12 will pass either the input signal 4 or its two's complement to the output terminal 14, depending on state of the PROM output 10.

As a result of the positioning, the even and odd channels will occupy the frequency spectra illustrated in FIGS. 7a and 7b, respectively.

Since the lower side band 18 and upper side band 16 of the frequency spectrum shown in FIG. 4 both consist of the same information, all of the information in any given channel may be preserved by preserving only the lower side band in any one of the mirrored frequency spectra. Since the lower side bands of even and odd channels occupy 4 kHz and are also represented by 4 kHz, it is possible to demultiplex the 64 TDM-PCM channels into 64 individual PCM signals, pass only the lower side band centered at 4L kHz in each of the L channels and combine the individual PCM signals to achieve a digital FDM signal having a composite band width of 0–256 kHz, wherein each of the 64 channels occupies a 4 kHz band. The equivalent of this is accomplished in the 3-section recursive filter 20, dual 128-point FFT processors 22 and 24, respectively, and weighting means 26.

The upper side bands are removed by passing the TDM-PCM signal through a sixth-order elliptic filter 20 with a 2 kHz cut-off and 50 dB out-of-band loss. The filter will be described in more detail hereinbelow. Briefly, the filter is realized as a cascade combination of three bi-quad sections and is time-shared over all 64 channels. The filter is reconfigured in real time as a low-pass filter for even channels and as a bandpass (centered at 4 kHz) filter for odd channels. The reconfiguration is accomplished by altering two of the coefficients of the transfer function of each bi-quad section for odd channels. This removes the upper side bands 16 from the frequency spectra shown in FIGS. 7a and 7b. The signal is next supplied to FFT processors 22 and 24 which operate as a coarse filter removing all but a selected lower side band in each channel, and the weighting means 26 serves as an enhancement filter to remove any overlap between the selected frequency spectra of adjacent channels.

The above-described filtering and combining operations performed by the FFT processor and weighting means could be achieved in a 256-tap transversal filter having a cut-off at 2 kHz, incorporating a sampling rate increase from 8 kHz/channel to 512 kHz/channel. Since the 64 channels in the PCM output signal $Z_n^L$ are each sampled at 8 kHz, the signal $Z_n^L$ consists of samples at a rate of 512 kHz where every 64th sample is from the same channel. The sampling rate for each channel can thus be effectively increased from 8 kHz to 512 kHz by merely treating as zero-valued samples the intermediate 63 samples which contain no information from the channel in question. The sampling rate increase can be achieved by merely inserting zero-valued samples between two samples of the output of filter 20. Denoting this rate-increased signal $X_n^L$, the filtering process is described as $$V_m = \sum_{L=0}^{63} \sum_{i=0}^{255} X_{m-i}^L [H_i \exp(j \frac{2\pi Li}{128})] \quad (2)$$

where $X_{m-i}^L$ is the value at each tap, and $H_i$ is the weighting factor assigned to each tap of the transversal filter. Interchanging the summation and keeping in view that $X_{m-i}^L$ is zero, except when $m - i$ is a multiple of 64, let $m = 64q + p$; $p = 0, 1 \ldots 63$ and denoting these non-zero values $Z_q^L$, $Z_{q-1}^L$, $Z_{q-2}^L$ and $Z_{q-3}^L$
for $i = P, P+64, P+128$ and $P+192$, respectively, let $$W_q(P) = \sum_{L=0}^{63} Z_q^L \exp(j \frac{2\pi PL}{128}) \quad (3)$$

then $$V_m = H_p W_q(P) + H_{p+64} W_{q-1}(P+64) + H_{p+128} W_{q-2}(P) + H_{p+192} W_{q-3}(P+64) \quad (4)$$

It will be apparent to those skilled in the art that equation (3) is equivalent to a 128-point Discrete Fourier Transform (DFT) for which the second half of the sequence is zero. In order to save processing time, equation (3) may be implemented in a pair of overlapped 128-point FFT processors so that for each 128-point data input, two 128-point FFTs are performed. The first 64 samples are augmented by 64 zeros to form a 128-point input array for FFT 22, and the second set of 64 samples are augmented by 64 zeros to form the input array for FFT 24. The outputs of FFT 22 and FFT 24 represent $W_{q-1}(P)$ and $W_q(P)$, respectively. A set of three previous outputs of these FFTs are also stored. These stored data are weighted and combined according to equation (4) in a manner well known in the art, and the output $V_m$ is a 64-channel digital FDM signal occupying the 0-256 kHz frequency band. The four dummy channels occupy the 0-10 kHz and 250-256 kHz band so that all voice information is carried in the 10-250 kHz band. The signal $V_m$ is then shifted up in frequency by 128 kHz in a digital mixer 28 which may be similar to the positioner 6, except that since every channel is to be shifted in the same direction rather than opposite directions, the channel information (L input terminal 9 in FIG. 6) is unnecessary. The output of mixer 28 is labeled $U_m$, and the 64 channels will occupy bands at 128-384 kHz. The 60 voice information channels will occupy bands from 138-378 kHz. The sampling rate is increased to 1536 kHz by inserting two zero-valued sampled between each sample of $U_m$, thus resulting in additional voice information image bands at 650-890 kHz and 1162-1402 kHz, and the center component (650-890 kHz) is kept by passing it through a bandpass filter 30. This filter is realized by a combination of a 7-tap transversal filter 32 and a 1-section recursive filter 34. The recursive filter 34 consists of one bi-quad section similar to those used in the 3-section recursive filter 20. The zero insertion may be accomplished by merely reading zeroes out of a memory in the transversal filter 32. Denoting the output of the filter 34 by $T_K$, the sampled super group is acquired by shifting the spectrum of $T_K$ down by 338 kHz and keeping the real part $(S_k)$ of the shifted spectra. This is done in a digital mixer 36 of the type well known in the art. It remains only to convert the signal $S_K$ to analog form and insert the pilot(s). This is done in a D/A converter of the type well known in the art having a sampling frequency $F_s$ equal to 1536 kHz. The analog signal is passed through a 6-pole elliptic low-pass analog filter 40 in which the pilot insertion takes place. The output 42 of the analog filter 40 is an analog FDM signal occupying the 312-552 band width.

The reverse FDM to TDM conversion is illustrated in the block diagram of FIG. 8. The incoming signal 44 consists of an FDM super group of 60 voice channels occupying the 312-552 kHz frequency band and pilot signals at some known frequencies. The pilots will be removed as a natural result of the demultiplexing. The super group is translated down by 302 kHz in a mixer 46, and the resulting signal is band limited to 250 kHz in a low-pass analog filter 48. The analog signal is passed through an A/D converter having a sampling frequency of 512 kHz, thereby forming an FDM-PCM signal having 60 voice channels and four dummy channels occupying the 0-256 kHz frequency spectrum, with each Lth channel (L = 0, 1, 2 ... 63) occupying the 4 kHz band centered at 4L kHz. Since the 512 kHz sampling frequency is twice the maximum frequency in the 0-256 kHz spectrum, the spectrum will be folded over to form an image spectrum from 256-512 kHz. Since the 60 voice channels occupy only the 10-250 kHz spectrum, the image spectrum of the voice channels will be at 266-506 kHz. The weighting circuit 52, FFT processor 54 and 3-section recursive filter 56 perform the reverse operation of their counterparts 22-28 in the TDM to FDM conversion.

Each channel is separated from its neighbors and shifted to a base band signal with an 8 kHz sampling rate. The separation can be accomplished in a 256-tap transversal filter, and the frequency shift of 4L kHz could be performed by modifying the tap weights $H_i$ to $G^{Li}$ defined by $$G^{Li} = H_i \exp(j \frac{2\pi \cdot 4Li}{512}) = H_i \exp(j \frac{2\pi Li}{128}) = H_i W_{128}^{Li} \quad (5)$$

where $i = 0, 1, 2, 3 \ldots 255$; $L = 0, 1, 2 \ldots 63$; and $$W_{128}^{Li} = \exp(j \frac{2\pi Li}{128}).$$

The filtered signal $C_n(L)$ is expressed by $$C_n(L) = \sum_{i=0}^{255} S_{64n-1} H_i W_{128}^{Li} \quad (6)$$

which can be rewritten as $$C_n(L) = \sum_{i=0}^{255} X(n,i) W_{128}^{Li} \qquad (7)$$

It will be apparent to one skilled in the art that equation (7) represents a 128-point DFT on a sequence $X(n,i)$ given by $$X(n,i) = H_i S_{64n-i} + H_{128+i} S_{64n-128i} \qquad (8)$$

Also note that the transform is performed on an overlapped sequence — i.e., a 128-point transform for every 64 input data points. This will require two real time simultaneous transforms on $X(n,i)$. Since all of the inputs to the weighting means 52 are real, the processor may be operated in a "two channel trick" mode so that only a single FFT processor is required rather than the two processors required in the TDM to FDM conversion illustrated in FIG. 2. This two channel trick mode will be described in more detail below.

Adjacent channel noise is removed by passing the output of FFT processor 54 through a 3-section recursive filter 56 which is multiplexed over all 64 channels and reconfigured as a low-pass recursive filter having a cut-off at 2 kHz for even channels and a 4 kHz bandpass filter for odd channels.

As mentioned earlier, both TDM to FDM and FDM to TDM conversion will require a 128-point FFT for every 64 data input samples. However, for the FDM to TDM side, the FFT input $X(n,i)$ is real (equation (7)) and, therefore, two transforms can be performed by utilizing a single hardware unit performing DFT, usually referred to as "two channel trick." Furthermore, the computational advantage of FFT algorithm can be exploited for performing DFT. Two channel trick is applied by decomposing $X(n,i)$ into two sequences, $E(n,i)$ and $F(n,i)$, for n odd and even, respectively, and combining these sequences to form a complex sequence $K(n,i)$, such that $$K(n,i) = E(n,i) + j F(n,k)$$

and DFT is given by $$K_n(L) = E_n(L) + j F_n(L)$$

such that the DFTs of the original sequences can be retrieved by $$E_n(L) = \tfrac{1}{2}[K_n(L) + K_n^*(128-L)]$$

$$F_n(L) = \tfrac{1}{2}[K_n(L) - K_n^*(128-L)]$$

where * denotes complex conjugate. This separation of the FFT output $K_n(L)$ into two sequences $E_n(L)$ and $F_n(L)$ can be achieved by merely altering the programming of the bi-quad filter structure 56 to perform the required mathematical operations.

The output format is arranged as $$E_n(0), E_n(1), \ldots E_n(63);$$

$$F_n(0), F_n(1), \ldots F_n(63) \ldots$$

corresponding to (for $n$ even)

$$C_{n-1}(0), C_{n-1}(1), \ldots C_{n-1}(63);$$

$$C_n(0), C_n(1), \ldots C_n(63) \ldots$$

from equation (7), which is a time multiplexed sequence for 64 PCM channels.

For the TDM to FDM side, this assumption is not true; hence, two FFT processors are required. Therefore, a total of three FFT processor modules are required in the transmultiplexer. The output $C_n^L$ is a PCM signal in which the frequency spectrum of each channel contains multiple 4 kHz side bands which are spaced by 4 kHz, and the side bands occupied by the even and odd channels are offset by 4 kHz relative to each other. The recursive filter output is modulated up and down by 2 kHz for even and odd channels, respectively, in a multiplier 58 which may be identical to the positioning means 6 shown in FIG. 2. The real part of the resulting signal $E_n^L$ is selected at 60 in a manner well known in the art, and the resulting signal is the desired TDM-PCM signal.

The two most important components in the above-described transmultiplexer are the recursive filters and the FFT processors, which constitute approximately 80% of the hardware needed for implementation of the transmultiplexer. These will now be described in detail.

It was discovered by means of computer simulation that the out-of-band loss requirements of the transmultiplexer could be achieved by cascading three bi-quad section recursive filters, but it was necessary to design such a cascaded arrangement of bi-quad sections which was capable of being multiplexed over all 60 channels of the super group and which was also capable of being reconfigured for even and odd TDM channels as a low-pass and bandpass filter, respectively.

The transfer function of a digital filter can be expressed as a ratio of polynomials in $Z^{-1}$ given by $$H(Z) = \frac{\sum\limits_{i=0}^{N} a_i Z^{-i}}{1 - \sum\limits_{i=1}^{N} b_i Z^{-i}} \qquad (9)$$

where $Z^{-i}$ represents $i$ units of delay and $a_i$ and $b_i$ are the coefficients. This direct form can be realized by either a parallel or cascade combination of second-order sections (two poles, two zeros), such as that shown in FIG. 9. This second-order section is also known as bi-quad because of its bi-quadratic nature. Different filter forms can differ substantially in the amount of required coefficient accuracy. In particular, a direct form suffers in this respect when compared to other forms such as cascade or parallel combination of bi-quad sections. The transfer function of a bi-quad section in Z-domain is given as follows:

$$H(Z) = \frac{1 + a_1 Z^{-1} + a_2 Z^{-2}}{1 - b_1 Z^{-1} - b_2 Z^{-2}} \qquad (10)$$

The set of difference equations describing a bi-quad section derived from equation (10) is given below:

$$W_K = X_K + b_1 W_{K-1} + b_2 W_{K-2} \qquad (11)$$

$$Y_K = W_K + a_1 W_{K-1} + a_2 W_{K-2} \qquad (12)$$

where $X_K$ is the input, $Y_K$ is the output and $W_K$'s are the intermediate results.

From a computational point of view, this set of equations can be represented as $$\theta_j = \sum_{j=1} C_j \psi_j \qquad (13)$$

where $C_j$'s are the coefficients, $\psi_j$ are the data and $\theta_j$ is the result.

A simple structure for computing equation (13) is shown in FIG. 10a. A PROM 62 stores the coefficients $C_j$ and supplies them to a multiplier 64 synchronously with the incoming data stream $\psi_j$, and the products are accumulated in the accumulator 68 and composed of an adder 66 and a latch 67. As shown in FIG. 10b, the simple structure of FIG. 10a can be improved by adding a scaler 70 in the feedback loop of the accumulator to limit the magnitude of the output $\theta_j$, and by also adding a separate storage device 72 so that the inputs $X_K$ may be added directly to the accumulator via tri-state parallel bus 74, thus eliminating the unnecessary multiplication of the inputs $X_K$ by unity coefficients. The use of a tri-state bus — i.e., a bus having only tri-state outputs connected thereto — eliminates the need for multiplexers to connect the various component outputs to the common bus, and results in a significant increase in operating speed.

Figure 10C:
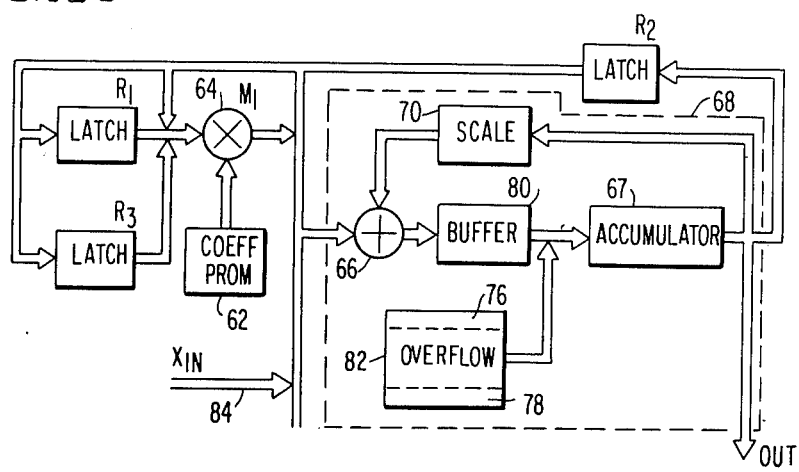

The overflow in two's complement number system can be detected by the following Boolean expression:

$$OVFL = Z_s \cdot \bar{X}_s \cdot \bar{Y}_s + \bar{Z}_s \cdot X_s \cdot Y_s \qquad (14)$$

where $X_s$ and $Y_s$ are the signs of addends and $Z_s$ is the sign of the result. The first term is true for an overflow as a result of addition of two large positive numbers, while the second term is true for addition of two large negative numbers. To prevent the modulo wrap around of the adder, a maximum allowable positive number or negative number can be loaded into the accumulator for first or second term being true respectively. This can be achieved by using three tri-state buffers 76, 78 and 80, and an overflow detection circuit 82 as shown in FIG. 10c. Buffer 76 contains the maximum positive number, buffer 78 contains the maximum negative number and buffer 80 contains the output of the adder. One of these three buffers is enabled, according to equation (14). Three registers labeled $R_1$ through $R_3$ provide the required storage. $R_1$ contains $W_{K-1}$ while $R_3$ contains $W_{K-2}$ and $R_2$ is used as a scratch pad memory. All these registers have tri-state outputs for interdata transfer. In FIG. 10c, the storage device 72 has been replaced by input terminal 84 in order to provide for continuous operation.

Figure 10D:
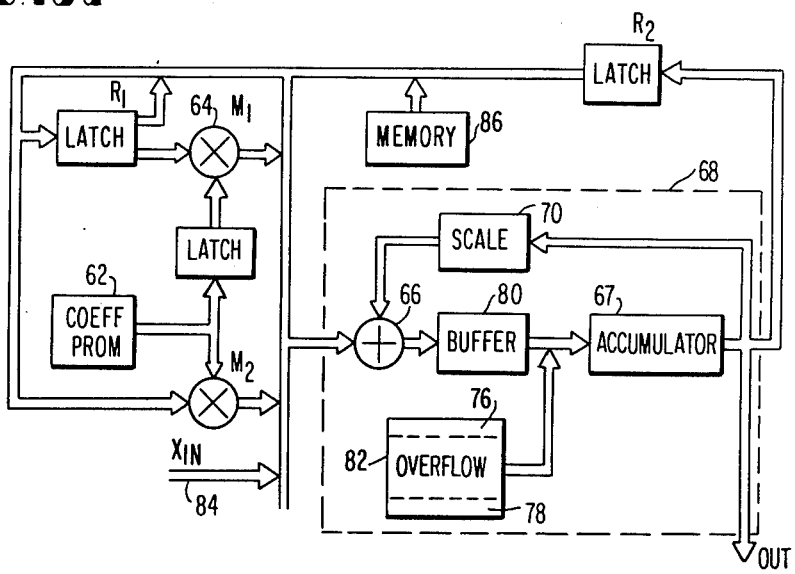

The speed of the structure of FIG. 10c can be increased by adding another multiplier. Some of the commercially available parallel multipliers, such as TRWs, MPYAJ series, have built-in registers for holding the operators (multiplier, multiplicand and result) and provide tri-state output also. A structure using two of these multipliers is shown in FIG. 10d. Note that register $R_3$ is eliminated due to the fact that $W_K$ and $W_{K-1}$ have to be loaded to the internal registers of the multipliers M1 and M2 only once in the whole computation cycle. A program for this bi-quad section operation is written as follows:

| | Operation | Interpretation |
|---|---|---|
| 1. | $0 \to ACC$ | Clear accumulator |
| 2. | $X_K + ACC \to ACC$; $R_1 \to M_1$; $R_2 \to M_2$ | Load input and multipliers |
| 3. | $M_2 \times b_1 + ACC \to ACC$ | Calculate feedback loop |
| 4. | $M_2 \times b_1 + ACC \to ACC$, | |

| | Operation | Interpretation |
|---|---|---|
| 5. | $R_2 \to R_2$ $ACC \to R_1$ | $W_{K-1} \to W_{K-2}$; $W_K \to W_{K-1}$ |
| 6. | $M_1 \times a_1 + ACC \to ACC$ | Store $W_K$ |
| 7. | $M_2 \times a_2 + ACC \to ACC$ | Calculate feed forward loop |
| 8. | $ACC \to D/A$ | Output $Y_K$ |
| 9. | Repeat 1 through 9 | | where $M_1$ and $M_2$ are the internal holding registers of the multipliers. Some of the operations can be performed simultaneously.

The bi-quad section discussed above can be multiplexed to realize higher order filters utilizing parallel or cascade structures. Parallel realization would require holding the input while the structure is multiplexed for M sections, and also retaining the contents of the accumulator between sections. In cascade realization, the output of the previous section becomes the input to the next section. This can be accomplished by retaining the contents of the accumulator instead of clearing it after the bi-quad section is done. Also, no new input $X_K$ would be required, but different coefficients corresponding to the transfer function of each cascaded filter would be supplied, and the length of the program would become M times the original program described earlier, where M is the number of cascaded filter sections.

The multiplexing requires the addition of storage to the basic bi-quad section. A RAM may be used for this purpose. The required RAM capacity would be N × 2M words, where M is the number of bi-quad sections per filter and N is the number of channels to be multiplexed. This capacity is dependent on computational capacity of the bi-quad which, in turn, depends on the multiplier speed. The state of the art is about 5 MHz multiplying speed for a parallel multiplier. Thus, with two multipliers, a throughput of 2–2.5 MHz for this bi-quad can be achieved. For audio applications where sampling frequency is 8 kHz, a total of 300 such bi-quad sections can be multiplexed requiring 600 words of storage. A tri-state memory 86 may be directly attached to the bi-quad structure without any change in the bi-quad structure itself. A different program would be required, and the transfer of data is between memory 86 and registers $R_1$ and $R_2$ instead of intertransfer between the registers as described earlier. Registers $R_1$ and $R_2$ are retained for scratch-pad usage.

The bi-quad computing structure described above can be viewed as a special purpose microprocessor which can be configured to a desired filter by programming. The programming is performed via a control vector or microinstruction[$\Phi$]. This microinstruction has P elements which are divided into three fields, $P_1$, $P_2$ and $P_3$. $P_1$ provides various controls for the arithmetic unit; $P_2$ provides the necessary address for the RAM; and $P_3$ provides the address for the coefficient PROM. Thus, vector [$\Phi$] can be represented as:

$$[\Phi] = [P_1 P_2 P_3] \qquad (15)$$

This vector can be the output of a PROM, which is described as a control PROM or microsequencer. A set of such vectors constitute a program such as described above.

If there are N filters, each having a varying number of bi-quad sections $M_i$, where $i = 1, 2, \ldots N$, and each section requires the performance of n operations, then the total length of the control PROM is given by $$L = \sum_{i=1}^{N} M_i n \qquad (16)$$

so that the control PROM requires L × P capacity. FIG. 11a represents a block diagram of a filter having this control PROM. The double lines represent two or more lines in the bus. A divide-by-L counter 88 and a control PROM 90 will control the operation of this filter.

The length L can be reduced by looping the program over similar filters, forming groups. A simplest looping example would be a single filter having M sections multiplexed over N channels. In this case, the length of the PROM will be reduced to $L_1$ given by $L = n \times M \times N$.

A further reduction in the size of control PROM is achieved by providing an extra counter 92 which counts the number of filters being multiplexed N. The address for individual section storage will still be provided by [Φ], but this modification will reduce the length of the vector [Φ] since part of field $P_2$ will be provided by the output of the counter, and the length $L_2$ of the control PROM will be given by $L = n \times M$. The modified control block diagram is shown in FIG. 11b.

A generalized example can be given by forming $N_j$ groups of the total N filters and assuming that $N_1$ filters contain $M_1$ bi-quad sections; $N_2$ filter contains $M_2$ bi-quad sections and so on, such that j programs will be required to process $N_j$ groups. These j programs can be stacked in the control PROM and they can be accessed by decoding the N counter output in a decoder 94 and using this output as an offset to the address provided by the sequence counter L. A change of stack will accompany by resetting of the L counter. The final block diagram is shown in FIG. 11c. The L counter is a variable modulo counter to accommodate various lengths of filter programs.

As mentioned above, it was discussed by means of computer simulation that the out-of-band loss requirements for the filters 20 and 56 in FIGS. 2 and 8, respectively, could be achieved by cascading three of the bi-quad section recursive filters shown in FIG. 10d in order to form a single sixth-order elliptic filter. Since the system requires 60 channels with a sampling frequency of 8 kHz to be multiplexed over this filter, the structure shown in FIG. 11b is used. The coefficient PROM is a 32 × 8 organization for storing three values of each of the non-unity coefficients $a_1$, $a_2$, $b_1$ and $b_2$ in equations (11) and (12) above. The control PROM 90 is a 32 × 16 organization for providing a control vector [Φ] with 16 elements. The divide-by-L counter 88 is a divide-by-32 counter, while the divide-by-N counter 92 is a divide-by-64. Three LSBs for RAM address are provided by [Φ], while the RAM 86 contains 256 × 16 words. The number system used is two's complement, and the internal computation is rounded off to 16 bits with saturating overflow. Multipliers $M_1$ and $M_2$ are 16 × 16 parallel multipliers, such as MPY16AJ, manufactured by TRW. In the TDM to FDM conversion, the input to the 3-section recursive filter 20 is complex, having both real and imaginary components due to the positioning operation in which the incoming PCM signal was multiplied by a complex quantity. Thus, both real and imaginary components for each channel must be filtered in the filter 20, resulting in a requirement of two filters per channel. Since each filter includes three sections and must be multiplexed over 64 channels, the total requirement of bi-quad sections is 64 × 3 × 2 = 384 bi-quad sections. Since, as discussed above, the capacity of the filter structure shown in FIGS. 10d and 11b for a clock frequency of 16 MHz is only 300 bi-quad sections, two filter structures, one for the imaginary components and one for the real components, are used to fulfill the requirements of filter 20 in FIG. 2. The filter 34 in FIG. 2 is only a 1-section recursive filter multiplexed over 64 channels, thus resulting in a bi-quad section requirement of 64 × 2 = 128 bi-quad sections, and a single filter structure is sufficient. In the FDM to TDM conversion, the input signals to the 3-section recursive filter 56 is always complex, so that wo high-speed multiplexed bi-quad structures are required as in TDM to FDM conversion.

In order to achieve the transmultiplexer of the present invention, it was necessary to provide an FFT processor capable of performing the required 128-point FFT as quickly as the 128 samples are provided. At a sampling rate of 512 1 kHz, the total time allowed to perform a 128-point FFT is 250 microseconds. It was also desirable to provide such a processor having low power consumption and small size. Another important feature in the FFT processor was that it should be capable of "stand-alone" operation — i.e., it should interface readily with other digital processors to enable the user to treat it as a black box component in the signal processing system. Finally, it was necessary to provide an FFT processor having the capability of performing 128-point FFT on two real channels simultaneously (two channel trick).

The algorithm chosen for the FFT is radix-2, fixed geometry, DIF, with ordered inputs and outputs. This algorithm has the advantage of a simpler indexing routine at the expense of double-the-memory capacity. Parallel multipliers are used in the complex arithmetic unit (Butterfly). DIF computation involves six additions and four multiplications. The additions are done before multiplication, and the multiplier delay is used for storage, which blends nicely with fixed geometry algorithm. The processor also has the flexibility of performing 256-point FFT or 128-point FFT on two real channels simultaneously (usually referred to as two channel trick) with a small external circuitry. Two's complement fixed point arithmetic is used, with computational word length of 16 bits and coefficient word length of 12 bits. Automatic array scaling is utilized between passes with multiplication results rounded off to 16 bits.

The algorithm chosen for the FFT is a radix-2, fixed geometry, DIF, ordered inputs and outputs and is shown only for 8-point FFT in FIG. 12a. The input data is arranged sequentially, and two complex data points, P and Q, spaced N/2 (N being the total number of points) are processed through the complex relations given by the following equation:

$$P' = \tfrac{1}{2}(P + Q)$$
$$Q' = \tfrac{1}{2}(P - Q) \times W \qquad (17)$$

where P' and Q' are two new complex points generated by the arithmetric process, and W is a complex coefficient. This process is termed as butterfly. The ½ scaling factor is not necessary for the performance of the 2-point transformation but is added to limit the magnitude of the computations. These two new points are stored sequentially in the memory. N/2 such operations are carried out until a whole new array of N points is produced. This is termed as a pass. The new array is processed again until $\log_2(N)$ such passes are complete. The output array thus produced is the DFT of the input data. It is evident that twice the memory capacity is required for reading and storing intermediate results. In this design, N = 128; therefore, 64 butterflies are performed and a total number of 7 passes are performed. A block diagram of the complete processing cycle is shown in FIG. 12b. During pass 1, input data are supplied by the input buffer 96, and the results are stored in the FFT memory 98. Passes 2-6 utilize the FFT memory for reading data and storing results. During pass 7, data are read from the FFT memory, and the results are stored in the output buffer 100.

The FFT is designed to operate in real time; therefore, each input and output buffer has two separate memories 102, 104 and 106, 108, respectively, labeled IA and IB for input buffer and OA and OB for output buffer. These memories operate in a ping-pong fashion — that is, while one is collecting the data, the other is supplying the data. The real time FFT processing is accomplished by establishing a pipelined operation between the input buffer, FFT memory and the output buffer (these memories serve as a pipeline). In other words, a set of 128 complex digitized data is collected during Rth period and is stored in IA. Assume a similar set was collected and stored in IB during period (R−1). Thus, during Rth period and pass 1, the butterfly is supplied with data from IB and the result is stored in FFT memory. During passes 2-6, the butterfly operates on data in the FFT memory (still Rth period), and during pass 7, the result is stored in A, while output is being read from OB. Then during period (R+1), IA, IB and OB switch among themselves. Thus, at any point in time, data belonging to three consecutive periods are flowing in the pipeline. The above operation is summarized as follows:

For R even,
1. Collect data in IA (Rth period).
2. Perform FFT on data stored in IB from period (R−1) and store the output in OA.
3. Output result of period (R−2) data from OB.

When R is odd,
1. Collect data in IB (Rth period).
2. Perform FFT on data stored in IA from period (R−1) and store the output in OB.
3. Output result of period (R−2) data from OA.

Each period is equal to 250μs.

The FFT processor is a stand-alone processor. The block diagram is shown in FIG. 13. The input to the processor is a 16-line input data bus 110, 12 line bus 112 for external address and a FFT start control line 114. The output is a 16 line data bus 116. Input and output are both represented in two's complement binary numbers. The major components of the system are: a High-Speed Butterfly (HSB9 118 for performing elemental 2-point transformation; a Random Access Memory (RAM) 120 consisting of input buffer, output buffer and FFT memory, each organized as 512 words × 16 bits; a coefficient Programmable Read-Only Memory (PROM) 122 containing W's and organized as 256 words × 12 bits; and an indexing and control circuit 124 generating addresses for all the memories in the system and controlling the flow of data within the system.

The HSB, shown in detail in FIG. 14, performs the complex arithmetic operation described by equation (17). This equation can be split into its real and imaginary parts as follows:

$$Re(P') = \frac{Re(P)}{2} + \frac{Re(Q)}{2} \quad (18a)$$

$$IMG(P') = \frac{IMG(P)}{2} + \frac{IMG(Q)}{2} \quad (18b)$$

$$LC = \frac{Re(P)}{2} - \frac{Re(Q)}{2} \quad (18c)$$

$$LD = \frac{IMG(P)}{2} - \frac{IMG(Q)}{2} \quad (18d)$$

$$Re(Q') = LC \times Re(W) + LD \times (\pm IMG(W)) \quad (18e)$$

$$IMG(Q') = LC \times (\pm IMG(W)) + LD \times Re(W) \quad (18f)$$

where $\pm$, in equations (18e) and (18f) represents forward or inverse transform.

The addition and multiplication are done simultaneously, and the delay of the multiplication process is utilized for storing and retrieving intermediate results. The HSB is composed of three 16-bit parallel adders labeled A1, A2 and A3, two parallel 16 × 16 multipliers M1 and M2 and seven registers marked A through G for holding intermediate results or data. Registers E and F and buffer H have tri-state outputs for selective storage into the memory. The basic butterfly operation requires 9 clock periods, and more than one operation is carried out per clock period.

The 16 × 16 parallel multipliers (e.g., TRW's 64 pin LSI MPY16AJ) are arranged as a 3-port devices containing XM, YM and ZM registers for storing multiplicand, multiplier and result, respectively. Four multiplications are achieved by loading the XM registers of M1 and M2 with LC and LD (equations (18c) and (18d), respectively). The YM registers of M1 and M2 are loaded with coefficients from latch G and from the output of the coefficients PROM 112, respectively. Latch G is also loaded from coefficient PROM 122 prior to the loading of the multiplier M1. The content of the XM registers are changed once during the bufferfly cycle, and two multiplications per multiplier are achieved by changing the content of the YM registers of the multipliers M1 and M2 according to equations (18e) and (18f).

Here again, a pipeline operation is being performed. The sum and difference are calculated (equations (18a)-(18d)) during a previous butterfly cycle, and the results are used for multiplication (equations (18e) and (18f)) in the current cycle while new sum and difference results are computed. The scalor 126 performs a divide-by-2 as required by equations (18a)-(18d). The scaling is controlled from the pass counter.

During the first clock period, Re(P') is stored into the memory from latch E. The content of latch E is computed according to equation (18a) in the previous butterfly cycle. The content of latches C and D (LC and LD computed according to equations (18c) and (18d)) are loaded into the XM registers of multipliers M1 and M2, respectively. The content of latch G (Re(W)) and output of the coefficient PROM 122 (+ IMG(W) at this time) are loaded into the YM registers of M1 and M2, respectively. The content of the XM registers of the multipliers (internal to the LSI) do not change for the rest of the butterfly cycle.

During the second clock period, latch F IMG(P')) is stored in the memory, IMG(W) from the coefficient PROM 122 is loaded into the latch G for the next multiplication and Re(W) is put on the output of the coefficient PROM. During the third clock period, Re(P) is loaded in latch A from the memory. During the fourth clock period, the content of latch A is pushed to latch B and Re(Q) from memory is loaded into latch A. The results of the first multiplications are clocked out, while YM registers of M1 and M2 are loaded from latch G and the coefficient PROM, respectively, and a second multiplication is started. During clock period five, the sum and difference (Re(P') and LC) are loaded into latches E and C, respectively, and latch A is loaded with IMG(P) from the memory 120. Clock period six allows the content of latch A to be pushed into latch B and allows latch A to be occupied by IMG(Q). Also, Re(W) is stored into latch G for the next cycle. During the seventh cycle, a sum and difference (IMG(P') and LD) are loaded into latches F and D, respectively. At this time, the Re(Q') is also ready and is loaded into the memory by enabling buffer H. During clock period eight, nothing is done because the multiplication result is not ready, but in the ninth period, the IMG(Q') is ready and loaded into the memory. The summarized algorithm for butterfly operation is shown below:

| Clock No. | Operations |
|---|---|
| 1. | [E] → MEM; [C] → M1; [D] → M2 |
|    | [G] → M1 -IMG(W) → M2 |
| 2. | [F] → MEM; ± IMG(W) → G |
| 3. | Re(P) → A |
| 4. | Re(Q) → B, [A] → B; [G] → M1; Re(W) → M2 |
| 5. | IMG(P) → A; [A] + [B] → E; [A] − [B] → C |
| 6. | IMG(Q) → A; [A] → B; Re(W) → G |
| 7. | [A] + [B] → F; [A] − [B] → D; [H] → MEM |
| 8. | No. OP; WAIT |
| 9. | [H] → MEM |

[ ] Means content of the register.

The FFT processor can be viewed as an 8-state machine, and the state diagram is shown in FIG. 15.

— $S_0$: Idle state.
— $S_1$: Initialization with read from IA memory.
— $S_2$: Initialization with read from IB memory.
— $S_3$: Read from IA memory and write in FFT memory.
— $S_4$: Read from IB memory and write in FFT memory.
— $S_5$: Read and write from FFT memory.
— $S_6$: Read from FFT memory and write in OA memory.
— $S_7$: Read from FFT memory and write in OB memory.

where the memory configuration is as shown in FIG. 16.

The operation of the FFT system can be more clearly understood by referring to FIGS. 15 and 16 and to FIG. 17 which shows a block diagram of the indexing and control circuit 124. In state $S_0$, the control PROM 128 is disabled. The FFT is driven to the next state by the FFT start pulse which is counted by a divide-by-2 counter. The transition to $S_1$ or $S_2$ is [0 or 1] according to the its count. This count is termed as BLOCK. This feature allows a stand-alone operation for use as a peripheral to the computer or any other system. The initialization routine clears all the counters in the system, except the FFT start counter (not shown), and loads the first pair of input points to the butterfly 118. The only difference in $S_1$ and $S_2$ is the data memory. After pass 1, the processor is driven into state $S_3$ or $S_4$, depending upon the path being followed. In these states, the butterfly gets its input data from the FFT memory and writes back the result in the same memory, through at different location. After passes 2–6, the FFT processor goes to $S_6$ or $S_7$, depending upon whether the BLOCK is 0 or 1. In these states, the butterfly input comes from the FFT memory and written in OA or OB memory for BLOCK = 0 or 1, respectively.

The control PROM address generation counter 126 is a divide-by-9 synchronous counter to accommodate the basic butterfly operation, which requires 9 clock periods as discussed earlier. The output of this counter serves as part of the address for the control PROM 128.

The asynchronous interface 130 contains two synchronous flages (e.g., flip-flops). Both are set with the FFT start pulse. The first flag output labeled ENABLE enables the control PROM 128 and resets by the FFT FINISH pulse. The second flag output labeled INITIAL STATE provides the MSB for the control PROM address and resets after 9 clock periods. This flag determines the length of the state $S_1$ or $S_2$. This flag also generates a clear pulse for all the counters in the system, except FFT START counter, which is also included in this interface.

Figure 18:
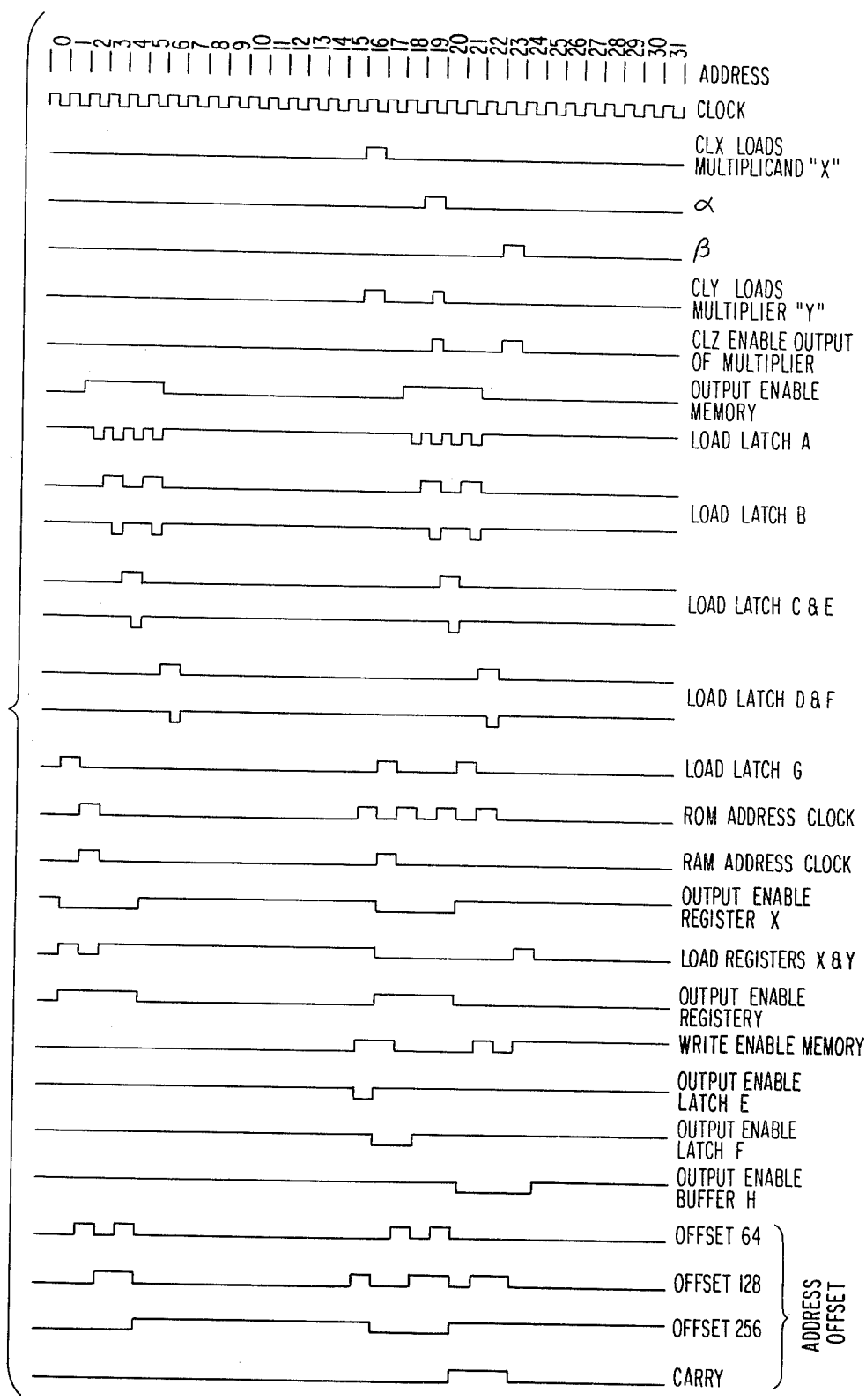
FIG. 18 is a timing diagram of the control signals generated by the control PROM shown in FIG. 17.

The control PROM 128 is organized as a 32 words × 24 bits memory. The 24 outputs serve as controls for various operations in the system. This is the only control in the whole system. The top half of the memory contains the initialization routine, while the bottom half contains the regular program. These halves are selected by the INITIAL STATE flag. All outputs of PROMs are latched for a stable operation. The latching delay is taken into account for overall operation. The program in form of timing diagram is shown in FIG. 18.

The address for the RAM 132 is generated in real time by utilizing a binary counter which holds the number of butterflies already processed and offsetting this number by a PROM generated offset. The modulo −4N (N = 128 for this application) of the resultant number will represent the address for the data to be read or written in the memory 120 at a specific instant in time.

During every butterfly cycle, a RAM address clock is generated. This clock is mounted by BUTTERFLY COUNTER (BC) depicted in the block diagram of RAM address generation circuit of FIG. 19. The BC is a divide-by-64 free running binary counter and represents the number of butterflies per pass. The carry ripple of this counter serves a clock for a divide-by-8 counter, labeled as PASS COUNTER (PC). This counter counts the number of passes made. The output of this counter, having three bits, $P_0$–$P_2$ is decoded for pass 1, pass 7 and FFT FINISH. These encoded outputs control the transition of the FFT processor's states and also serves as a control for reading and writing from input and output memories, respectively.

Figure 20:
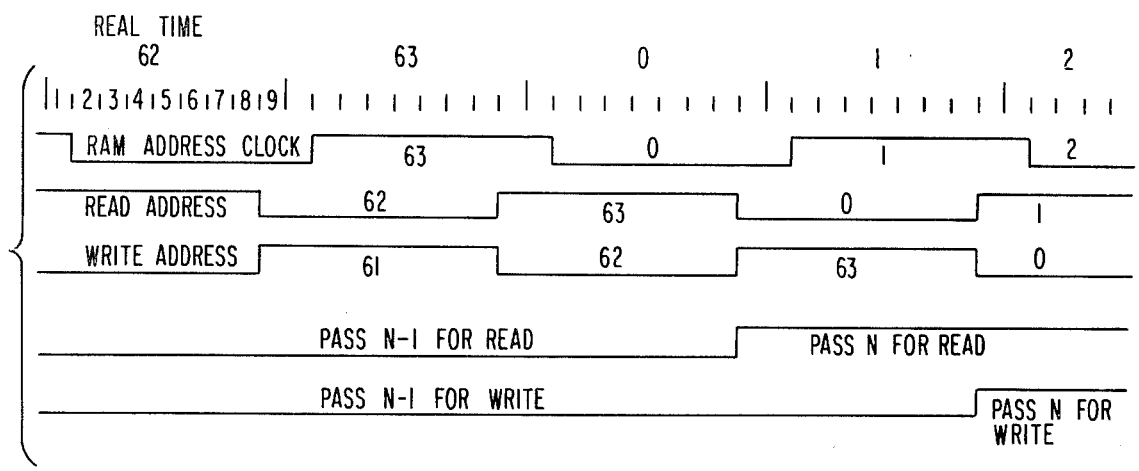
FIG. 20 is a timing diagram for various pass control signals of the FFT processor.

The pipeline operation of the butterfly produces a lag between read and write address as described earlier, and, therefore, this lag is also transferred to the transition between passes. A timing diagram for these transitions is shown in FIG. 20. This figure represents a relationship between absolute butterfly count and read and write count at the time of pass transition.

For a 128-point FFT, the memory required (excluding input and output buffer) is 512 words. The FFT memory is arranged as 512 words × 16 bits. For odd passes (1, 3, 5, 7) for which $P_0$ (LSB of pass counter) is zero, the data are written in the bottom half and read from the top half of the memory, except in passes 1 and 7. (In pass 1, the data are read from input memories 102 and 104 instead of FFT memory 98, and in pass 7, the data are written in output memories 106 and 108 instead of the FFT memory.) For even passes (2, 4, 6) for which $P_0 = 1$, the data are read from the bottom half and written into the top half of the memory. Note that reading and writing are done according to the example 8-point FFT in FIG. 12a. The FFT memory is allocated as follows:

| Location | Data |
|---|---|
| 0 – 127 | Real |
| 128 – 255 | Imaginary |
| 256 – 383 | Real |
| 384 – 511 | Imaginary |

Therefore, according to FIG. 12a, the required address sequence becomes:

| $P_O$ | BC | Read Address | Write Address |
|---|---|---|---|
| 0 | 0 | 0, 64, 128, 192 | 256, 384, 257, 385 |
| | 1 | 1, 65, 129, 193 | 258, 386, 259, 387 |
| | . | . | . |
| | . | . | . |
| | . | . | . |
| | 62 | 62, 126, 190, 254 | 380, 508, 381, 509 |
| | 63 | 63, 127, 191, 255 | 382, 510, 383, 511 |
| 1 | 0 | 256, 320, 384, 448 | 0, 128, 1, 129 |
| | 1 | 257, 311, 385, 449 | 2, 130, 3, 131 |
| | . | . | . |
| | . | . | . |
| | . | . | . |
| | 62 | 318, 382, 446, 510 | 124, 252, 125, 253 |
| | 63 | 319, 383, 447, 511 | 126, 256, 127, 255 |

This sequence is produced by the following arithmetic operation. Let the output of the BC be represented as $(B_0-B_5)$ ($B_5$ being MsB). Then, at any point in time, the magnitude of the number represented by BC is $$\sum_{n=0}^{5} B_n \cdot 2^n.$$

Two numbers X and Y are formed such that $$X = P_0 \cdot 2^8 + 0 \cdot 2^7 + 0 \cdot 2^6 + \sum_{n=0}^{5} B_n \cdot 2^5$$

and $$Y = P_0 \cdot 2^8 + 0 \cdot 2^7 + B_5 \cdot 2^6 + B_4 \cdot 2^5 + \ldots + B_0 \cdot 2^1 + 0 \cdot 2^0$$

Then the various read and write results $X_p$ and $Y_p$ are computed as follows:

$$X_p = (X + Z_p)_{512} \quad P = 1, 2, 3 \text{ and } 4$$
and
$$Y_p = (Y + Z_p + 4)_{512} \quad P = 2, 3, 3 \text{ and } 4$$

where $(\quad)_{512}$ represents modulo 512 count. The offset $Z_k$; $K = 1, 2, 3 \ldots 8$ are given as follows:

$$Z_1 = 0; Z_2 = 2_6; Z_3 = 2_7; Z_4 = 2^7 + 2^6$$

and $$Z_6 = 2^8; Z_6 = 2^8 + 2^7; Z_7 = 2^8 + 2^0; Z_8 = 2^8 + 2^7 + 2^0$$

A closer look at this addition reveals that offset $Z_k$ is always zero for bits 1–5, and no carry is generated for any digit; therefore, it can be implemented by half adders (or just four exclusive OR gates), adding LSB and three MSBs of two addends. The offset is generated by control PROM 128, and the timing is shown in FIG. 18. X and Y registers shown in FIG. 19 are each 8-bit registers instead of 9 bits. This is made possible by the fact that in X or Y, the coefficient of $2^7$ is always zero, so it need not be stored, but taken into account at the addition. Also, these registers are tri-state and eliminate the need for a multiplexer.

The FFT cycle count (BLOCK) controls the input memories 102 and 104 for read/write operation. For writing, the external address is used, and for reading, FFT address is used. These address lines are multiplexed to generate the address for input memory.

In order to provide for two channel trick operation, a 3:1 multiplexer is used for output buffer address generation as shown in FIG. 19. Also, the data in the output memory is bit reversed. Bit reversing is achieved by reversing the order of the address lines. For writing, the FFT address is provided. For regular output, a bit reversed external address is provided. For two channel trick, $K = 128$ addresses are required (two addresses per N) and their sequence is as follows for any N. (N being 0, 1, … 63); 0, 0, 1, 127, 2, 126 … 63, 65, and this is achieved by supplying regular bit reversed address for K = even. For K = odd, first two's complement is performed and then bit reversing. The multiplexing of the regular FFT address, regular bit reversed external address and the bit reversed two's complement of the external address is performed by multiplexers 131 and 133. An example is given below for a 7-bit binary number system.

| K | N | Binary N MSB LSB | Two's Complement MSB LSB | Bit Reverse N MSB LSB |
|---|---|---|---|---|
| 0 | 0 | 0000000 | NO | 0000000 |
| 1 | 0 | 0000000 | 0000000 | 0000000 |
| 2 | 1 | 0000001 | NO | 1000000 |
| 3 | 1 | 0000001 | 1111111 | 1111111 |
| 4 | 2 | 0000010 | NO | 0100000 |
| 5 | 2 | 0000010 | 1111110 | 0111111 |

The bit reversed address will pick up the required data for the output.

Figure 21:
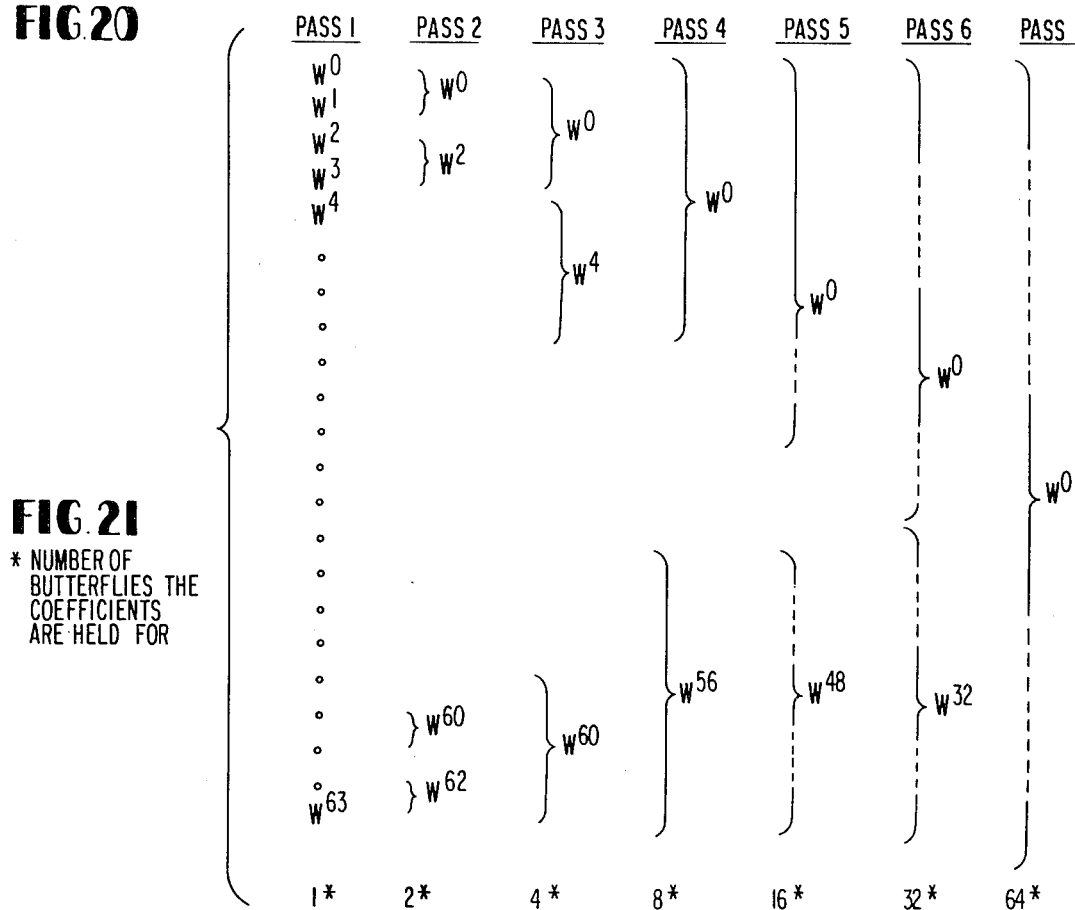
FIG. 21 is a table indicating the sequence of complex butterfly coefficients.
Figure 22:
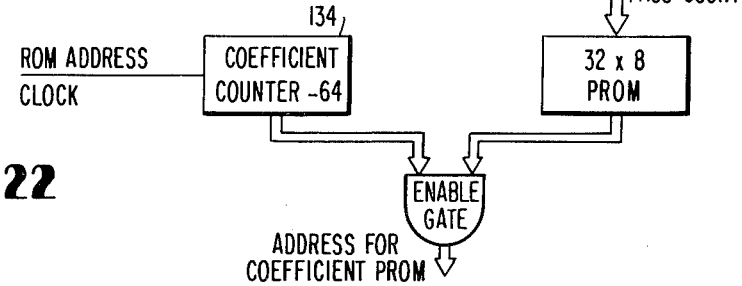
FIG. 22 is a block diagram of the coefficient PROM address generation circuit shown in FIG. 17.

As mentioned earlier, the coefficient PROM 122 is divided into four quadrants, the reason being a simple address generation and a quick transition for FFT to IFFT. For DIF operation, the sequence of coefficient required is shown in FIG. 21. FIG. 22 represents a block diagram for coefficient generation circuit. The counter 134 is divide-by-256 binary counter which is updated four times every butterfly. The two LSBs of the counter provide two MSB's of the address for the coefficient PROM. For FFT, the sequence is real, −IMG, IMG and real; for IFFT, the sequence becomes real, IMG, −IMG and real. This change is accomplished by reversing the two address MSBs of the coefficient PROM using a simple switch 135 (FIG. 17).

The sequence of the coefficient is generated by enabling all $A_0-A_5$ in pass 1; $A_1-A_5$ in pass 2; $A_2-A_5$ in pass 3; and so on until pass 7 only $A_5$ is enabled, where $A_0-A_5$ are the five bits of the output of counter 134 shown in FIG. 22. This method will cut the requirements for a very large PROM.

The FDM/TDM processor according to the present invention was designed to provide a practical transmultiplexing interface between the traditional single side band, suppressed carrier, FDM voice channels and 8-bit TDM-PCM voice channels. One specific application considered for the FDM/TDM transmultiplexer was the earth-station interface for TDMA/DSI operation via satellite. However, during the course of its development, it has become clear that the transmultiplexer according to the present invention can also be used to add, drop and reorder channels for transmission carrier make-up. Because the digital interface of the FDM/TDM processor provides and accepts 60 individual voice channels in an 8-bit PCM TDM format, simple time division gating techniques may be used to provide a reliable and inexpensive means of adding or dropping channels, as well as reordering channels as required to meet the appropriate satellite or terrestrial carrier configurations. Since these processes are performed in the digital domain, the add, drop and reorder operations may be readily changed using simple control patch panels or pre-tested read-only memories. Using these techniques, the carrier configurations may be changed in a manner of seconds with full confidence as to the channel distributions of the new configuration.

Because all channels are available in the reorder processes, any channel may be selected for test and calibration. Channel selection may be made either manually or automatically as desired. In the event that a particular channel is to be tested, a simple thumb-wheel switch may be used to connect the conditioned channel signal to the desired test device, or an automatic sequencer may be used to systematically select and monitor each channel for a short period of time. Such a periodic check, along with other standard earth-station monitor and control units, would assure that all channels were operating satisfactorily, or if failed, where the failure occurred (in the incoming transmission channel or in the earth station).

The transmultiplexer is achieved by a modular design in which a novel FFT processor and high-speed multiplexed bi-quad recursive filter section constitute approximately 80% of the hardware of the system. Both are capable of very high-speed operation while consuming low power and requiring relatively little space.

The FFT processor interfaces readily with other digital processors, thereby enabling the user to treat it as a black-box component in his signal processing systems. The filter is programmable and operates at high enough speeds to enable multiplexing over an entire 60-channel super group while shifting the frequency response of the filter between channels. The filter structure could also be used as a high-speed peripheral to a microprocessor by replacing all the PROMs in the system by RAMs and loading the filter data from a microprocessor.

What is claimed is:

1. A high-speed digital arithmetic structure for implementing a recursive digital filter having a filter response defined by a plurality of filter coefficients, comprising:
   a parallel bus;
   means for providing filter input data samples to said parallel bus;
   multiplication means having a tri-state output terminal coupled to said parallel bus, a first input terminal coupled to said parallel bus, and a second input terminal;
   accumulating means having input and output terminals coupled to said parallel bus, said accumulating means providing at its output terminal a filter section output value comprising the accumulated value of said input data samples and the outputs from said multiplication means;
   first storage means for storing said coefficients and for supplying said coefficients to the second input terminal of said multiplication means;
   second storage means having a tri-state output terminal and an input terminal, both coupled to said parallel bus, said second storage means receiving and storing previous filter section output values and providing said previous values to the first terminal of said multiplication means; and
   programmable control means for controlling both the coefficient values and the operating sequence of said multiplication means, accumulating means and first and second storage means in order to provide a desired filter response.

2. A high-speed arithmetic structure according to claim 1 wherein said accumulating means comprises:
   an adder having first and second input terminals and an output terminal, said first adder input terminal being coupled to said parallel bus;
   a first buffer for receiving and storing the most recent output of said adder, said first buffer having an output terminal;
   an accumulating latch having an input terminal coupled to said first buffer output terminal and an accumulating latch output terminal for providing the output of said accumulating means;
   scalor feedback means for providing a scaled value of said accumulating latch output to said second adder input terminal;
   a second buffer for storing a maximum permissible positive adder output value;
   a third buffer for storing a maximum permissible negative adder output value; and
   overflow detection means, connected between said first buffer output and said accumulating latch input, for determining when the value in said first buffer exceeds the value in either said second or said third buffer and for providing the exceeded value to said accumulating latch input, said overflow detection means permitting the value in said first buffer to pass to said accumulating latch input when neither of said maximum permissible values is exceeded.

3. A high-speed arithmetic structure according to claim 1 wherein said first storage means is a programmable read-only memory (PROM).

4. A high-speed arithmetic structure according to claim 1 wherein said second storage means comprises first and second latch circuits with tri-state outputs capable of inter-latch data transfer.

5. A high-speed arithmetic structure according to claim 4 further comprising:
   a third latch having an input coupled to said accumulating latch output and a tri-state output coupled to said parallel bus.

6. A high-speed arithmetic structure according to claim 4 wherein said second storage means further comprises:
a random access memory (RAM) having an input and a tri-state output coupled to said parallel bus.

7. A high-speed arithmetic structure according to claim 1 wherein said multiplication means comprises first and second multipliers, each multiplier receiving at its second input terminal a different filter coefficient from said first storage means, and each multiplier receiving at its first input terminal a different previous filter section output from said second storage means.

* * * * *

UNITED STATES PATENT AND TRADEMARK OFFICE
CERTIFICATE OF CORRECTION

PATENT NO. : 4,117,541

DATED : September 26, 1978

INVENTOR(S) : Mian Zaheer ALI

It is certified that error appears in the above-identified patent and that said Letters Patent are hereby corrected as shown below:

IN THE SPECIFICATION:

Column 2, line 13 - delete "buss" insert -- bus --

Column 4, line 37 - delete "represented" insert -- separated --

Column 5, line 20 - delete "$X_{m-i}{}^L$" insert -- $X^L_{m-i}$ -- line 23 - delete "$X_{m-i}{}^L$" insert -- $X^L_{m-i}$ -- line 25 - delete "$Z_{q-1}{}^L, Z_{q-2}{}^L$ and $Z_{q-3}{}^L$"

insert -- $Z^L_{q-1}, Z^L_{q-2}$ and $Z^L_{q-3}$ --

Column 12, line 16 - delete "wo" insert -- two -- line 23 - after "512" delete "I"

UNITED STATES PATENT AND TRADEMARK OFFICE
CERTIFICATE OF CORRECTION

PATENT NO. : 4,117,541
DATED : September 26, 1978
INVENTOR(S) : Mian Zaheer ALI

It is certified that error appears in the above-identified patent and that said Letters Patent are hereby corrected as shown below:

IN THE SPECIFICATION:

Column 13, line 38 - before "OB" insert -- OA, -- line 60 - delete "(HSB9" insert -- (HSB) --

Column 16, line 49 - delete "mounted" insert -- counted -- line 58 - delete "encoded" insert -- decoded --

Column 17, line 55 - delete "$P_0 \cdot 2^8$" insert -- $P_0 . 2^8$ --

- delete "$B_n \cdot 2^5$" insert -- $B_n . 2^5$ --

UNITED STATES PATENT AND TRADEMARK OFFICE
CERTIFICATE OF CORRECTION

PATENT NO. : 4,117,541

DATED : September 26, 1978

INVENTOR(S) : Mian Zaheer ALI

It is certified that error appears in the above-identified patent and that said Letters Patent are hereby corrected as shown below:

IN THE SPECIFICATION:

Column 18, line 4 - delete "$Z_2 = 2_6$; $Z_3 = 2_7$;

insert -- $Z_2 = 2^6$ ; $Z_3 = 2^7$ ; -- line 62 - after "coefficient" insert -- address --

*Signed and Sealed this*

*Twentieth* Day of *February 1979*

[SEAL]

Attest:

RUTH C. MASON
*Attesting Officer*

DONALD W. BANNER
*Commissioner of Patents and Trademarks*